United States Patent [19]

Srivastava

[11] Patent Number: 5,121,086
[45] Date of Patent: Jun. 9, 1992

[54] PLL INCLUDING STATIC PHASE ERROR RESPONSIVE OSCILLATOR CONTROL

[75] Inventor: Gopal K. Srivastava, Arlington Heights, Ill.

[73] Assignee: Zenith Electronics Corporation, Glenview, Ill.

[21] Appl. No.: 682,484

[22] Filed: Apr. 9, 1991

[51] Int. Cl.[5] .......................................... H03L 7/085
[52] U.S. Cl. ........................................ 331/11; 331/17; 331/20; 331/25; 358/158
[58] Field of Search .................. 331/10, 11, 12, 17, 331/25, 20; 358/158, 159

[56] References Cited

U.S. PATENT DOCUMENTS 4,107,623  8/1978  Graf et al. ...................... 331/11 X Primary Examiner—Siegfried H. Grimm

[57] ABSTRACT

A static phase error responsive oscillator control includes a phase detector coupled to a source of horizontal synchronizing pulses, a low pass filter, an error amplifier, a voltage controlled oscillator having a frequency equal to a multiple of the horizontal scan frequency, and a corresponding frequency divider. A threshold detector responds to error signals in excess of predetermined upper and lower thresholds to indicate large magnitude frequency corrections. An averaging circuit determines the long term character of the large magnitude corrections to alter the free-running or static frequency of the oscillator. Once the free-running frequency is corrected, static phase error is substantially reduced or eliminated.

14 Claims, 2 Drawing Sheets

PLL INCLUDING STATIC PHASE ERROR RESPONSIVE OSCILLATOR CONTROL

FIELD OF THE INVENTION

This invention relates generally to television receivers and particularly to the synchronization and control of display scan systems therein.

BACKGROUND OF THE INVENTION

Several different types of television broadcast formats and standards are used in different locales throughout the world. Two of the most pervasive are the system used in the United States of America known as NTSC (National Television Standards Committee) and the European system known as PAL (Phase Alternating Line). In addition, several systems for providing increased picture resolution or definition, generally referred to as HDTV (High Definition Television) have been and are continuing to be developed.

While the television receivers operating in these varied systems are equally varied, certain aspects remain generally similar. For example, most television receivers include circuitry for selecting the desired television signal from among a plurality of broadcast signals available, a signal processing system which recovers the picture and sound information from the broadcast signal, systems for sequentially scanning a display device such as a cathode ray tube in both horizontal and vertical directions, and scan synchronization systems operative upon the display to coordinate display scanning to the picture and sound information.

Despite significant differences between the signal selection and signal processing functions of television receivers operating in accordance with the above-mentioned variety of broadcast systems, the functions of display scanning and synchronization are generally quite similar. Generally, picture and sound information together with scan synchronizing signals are modulated upon a broadcast carrier at the transmitter. At the receiver, the scan synchronizing signals are separated from the remainder of the picture and sound information and used to control locally generated horizontal and vertical scan signals. The latter are used to drive the display scanning circuits of the display system.

Computer monitors and many video game devices are also similar to television receivers in that a display system, such as a cathode ray tube, is scanned in synchronism with picture information. In such systems, the scan signals are computer generated and are used to synchronize display scan and picture information in much the same manner as television receivers.

One of the most demanding aspects of display system synchronization is that of controlling the horizontal scan oscillator. This critical function is made challenging by the need for precise control of both the frequency and phase of the horizontal scan oscillator. One of the most common and pervasive horizontal oscillator control systems used in both television receivers, computer monitors, or video games is generally referred to as a phase locked loop. While a variety of different phase locked loop systems have been developed, the prior art system shown in FIG. 1 is typical and provides a helpful basis for understanding the basic problems associated with horizontal oscillator control.

With reference to FIG. 1, a typical phase locked loop system is constructed in accordance with the prior art and generally referenced by numeral 10. A sync signal separator 12 operates in accordance with conventional fabrication techniques to extract the horizontal scan synchronizing signals from the remainder of the received television signal to provide a reference signal input to a conventional phase detector 11. Phase detector 11 includes a pair of inputs 13A coupled to sync separator 12 and 13B coupled to the horizontal drive signal. Phase detector 11 produces an output signal at output 14 representative of the difference between inputs 13A and 13B. The output of phase detector 11 is coupled to a low pass filter 16 which in turn is coupled to an error amplifier 17. A voltage controlled oscillator 18 having an output frequency determined in part by the error signal applied by error amplifier 17 produces a periodic output signal which is coupled to a frequency divider 19. The output of frequency divider 19 is applied to input 13B of phase detector 11 and to the horizontal scan system.

In operation, phase detector 11 compares the output signal of frequency divider 19 to the reference synchronizing signals at input 13A. An error voltage indicative of the difference therebetween is filtered by low pass filter 16 and amplified by error amplifier 17 to produce a controlling voltage for voltage controlled oscillator 18. In the event voltage controlled oscillator 18 is precisely synchronized to the referenced synchronizing signals at input 13A, the output voltage of phase detector 11 is zero and the frequency of voltage controlled oscillator 18 remains unchanged. In practice, however, this condition seldom exists and, more typically, the frequency of voltage controlled oscillator 18 differs from that of the incoming reference signals. If the difference between oscillator 18 and the reference signals detected by phase detector 11 is a phase difference or minor frequency difference, the error voltage coupled to oscillator 18 by filter 16 and amplifier 17 causes oscillator 18 to change frequency in the direction which brings its output signal toward synchronization with the reference sync signals. It has been found that prior art systems of the type shown in FIG. 1 respond well to minor variations of phase and frequency between oscillator 18 and the reference synchronizing signals.

If, however, a substantial frequency difference exists between the frequency of signals produced by oscillator 18 and the reference synchronizing signals, a correspondingly large error voltage is produced by phase detector 11 which is amplified by error amplifier 17 to produce a substantial change of frequency in voltage control oscillator 18. As is well known, conventional phase locked loop systems respond to large frequency differences by reaching an equilibrium point in which a sufficient error voltage is maintained by the phase detector to provide the necessary control of the oscillator. This equilibrium results in a condition in which the frequency of oscillator 18 is sychronized to that of the incoming reference sync signals while a phase difference or phase error between oscillator output signals and sync signals remains. This phase error is referred to in the art as static phase error. In systems of the type shown in FIG. 1, the ability of the system to make large frequency compensations is accompanied by correspondingly large static phase errors. Thus, practitioners in the art generally must compromise system performance to provide the necessary frequency compensation characteristic at the expense of static phase error.

In attempting to minimize or overcome the need for such compromise of system performance, practitioners in the art have endeavored to provide improved systems. Such attempts have included multiple loop control systems and systems which alter the loop gain in response to frequency lock or out of lock conditions. While such attempts have improved certain aspects of the system performance, they have often been beset by difficulties associated with increased complexity or transition difficulties between the in-sync and out-of-sync condition of system operation. There remains, therefore, a need in the art for an improved horizontal scan oscillator control system which minimizes static phase error.

Accordingly, it is a general object of the present invention to provide an improved horizontal scan oscillator control system. It is a more particular object of the present invention to provide an improved oscillator control system which responds to and corrects static phase error.

BRIEF DESCRIPTION OF THE DRAWINGS

The features of the present invention, which are believed to be novel, are set forth with particularity in the appended claims. The invention, together with further objects and advantages thereof, may best be understood by reference to the following description taken in conjunction with the accompanying drawings, in the several figures of which like reference numerals identify like elements and in which:

DESCRIPTION OF THE PREFERRED EMBODIMENT

Figure 2:
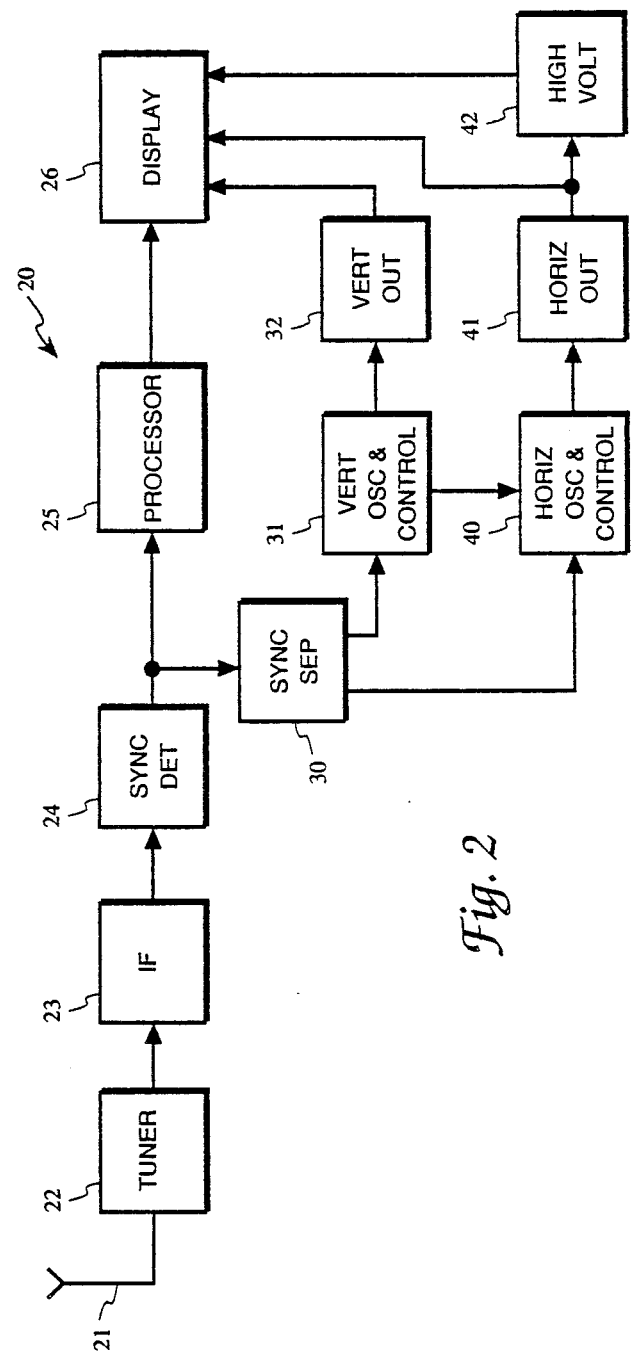
FIG. 2 sets forth a block diagram of a television receiver constructed in accordance with the present invention.

FIG. 2 sets forth a block diagram of a television receiver constructed in accordance with the present invention and generally referenced by numeral 20. Receiver 20 includes a receiving antenna 21 coupled to a tuner 22. Tuner 22 is coupled to an intermediate frequency system 23 which in turn is coupled to a synchronous detector 24. A signal processor 25 which includes conventional systems for processing picture and sound information is coupled to a display 26. A sync signal separator 30 is coupled to the output of synchronous detector 24. A vertical scan oscillator and control system 31 is coupled to sync separator 30 and a vertical output amplifier 32. The latter is coupled to display 26. A horizontal scan oscillator and control system 40 is coupled to sync separator 30 and a horizontal output amplifier 41. The latter is coupled to display 26 and a high voltage generator 42. High voltage generator 42 produces the high voltage potential required for display 26.

In operation, antenna 21 receives one or more broadcast television signals which are applied to tuner 22. Tuner 22 includes conventional channel selection systems for selecting the desired one of the plurality of signals received by an antenna 21 and for converting the selected signal to an intermediate frequency signal which is further processed by intermediate frequency processor 23. Synchronous detector 24 operates upon the intermediate frequency signal to recover the picture, sound, and scan synchronizing signals modulated thereon. The picture information is further processed by signal processor 25 to produce appropriate picture information signals to control display 26.

Sync separator 30 extracts the vertical and horizontal scan synchronizing signals from the composite signal at the output of synchronous detector 24 and applies them to vertical scan oscillator and control 31 and to horizontal scan oscillator and control 40. In response to the applied vertical scan signals from sync separator 30, vertical oscillator and control 31 produces a synchronized vertical scan signal which is amplified by vertical scan output system 32 and applied to display 26 to produce the vertical scan thereof. By means set forth below in greater detail and in accordance with the present invention, horizontal scan oscillator and control 40 produces a horizontal scan signal which is synchronized to the horizontal sync signals provided by sync separator 30. This output signal is further amplified by horizontal output 41 and applied to display 26 to produce the synchronized horizontal scan of display 26. In addition, high voltage system 42 responds to the output signal of horizontal output 41 to produce a high voltage operating potential for display 26.

With the exception of horizontal scan oscillator and control 40, television receiver 20 may be constructed in accordance with virtually any of the known conventional fabrication techniques. Conversely, horizontal scan oscillator and control 40, described below in greater detail, functions in accordance with the present invention to produce horizontal scan signals which are maintained in frequency and phase synchronization to the reference horizontal sync signals over a wide range of scan frequencies. In addition, horizontal scan oscillator and control 40 avoids the above-described objectionable static phase error compromise which is required in prior art systems.

It should be apparent to those skilled in the art that while the environment in which the present invention horizontal scan oscillator and control is situated in FIG. 2 is that of a television receiver, the present invention horizontal oscillator and control may be used with equal benefit in a variety of environments such as computer monitors and video game displays or other display systems.

Figure 3:
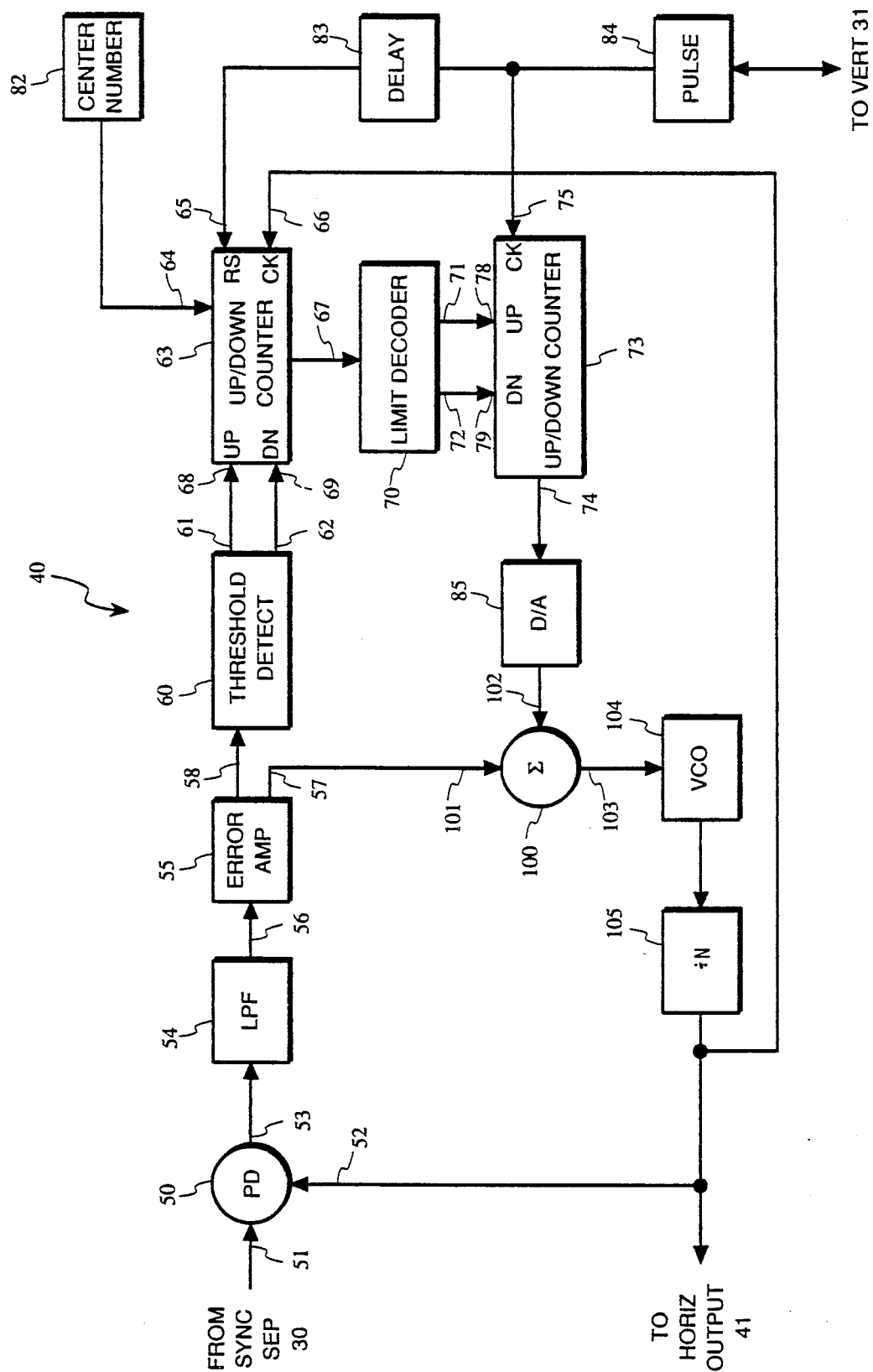
FIG. 3 sets forth a block diagram of a static phase error responsive oscillator control constructed in accordance with the present invention.

FIG. 3 sets forth a block diagram of the present invention horizontal scan oscillator and control generally referenced by numeral 40. A phase detector 50 which may be constructed in accordance with conventional fabrication techniques, includes an input 51 coupled to sync separator 30 (seen in FIG. 2), an input 52 and an output 53. A low pass filter 54 is coupled to phase detector output 53. An error amplifier 55 includes an input 56 coupled to the output of low pass filter 54 and a pair of outputs 57 and 58. A summing network 100 includes an input 101 coupled to output 57 of error amplifier 55, an input 102 and an output 103. A voltage controlled oscillator 104 is coupled to output 103 of summing network 100 and to a frequency divider 105. The latter is coupled to horizontal output 41 (seen in FIG. 2) and to input 52 of phase detector 50.

A threshold detector 60 is coupled to output 58 of error amplifier 55 and includes a pair of outputs 61 and 62. An up/down counter 63 includes an up-counting input 68 coupled to output 61 of threshold detector 60 and a down-counting input 69 coupled to output 62 of threshold detector 60. Up/down counter 63 further includes reset input 65, a clock signal input 66 and an input 64 and an output 67. A limit decoder 70 is coupled to output 67 of up/down counter 63 and includes a pair of outputs 71 and 72. An up/down counter 73 includes an up-counting input 78 coupled to output 71 of decoder 70 and a down-counting input 79 coupled to output 72 of limit decoder 70. Up/down counter 73 further includes an output 74 coupled to a digital to analog converter 85 and a clock signal input 75 coupled to pulse circuit 84.

Figure 1:
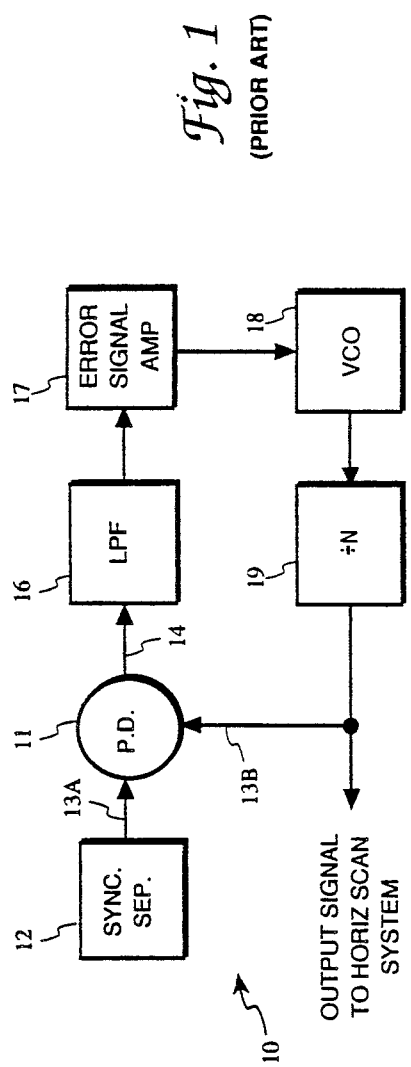
FIG. 1 sets forth a typical prior art phase locked loop system.

In operation and by way of overview, the function of the present invention horizontal scan oscillator and control is believed best understood by initially noting that the combination of phase detector 50, low pass filter 54, error amplifier 55, voltage controlled oscillator 104 and frequency divider 105 form a phase locked loop similar to the prior art phase locked loop shown in FIG. 1. This loop responds to minor or short duration changes of oscillator frequency or phase in a generally conventional manner. Summing network 100 and the remaining components shown in FIG. 3 provide the additional performance of the present invention system which produce the desired enhanced capability which responds to longer duration oscillator errors to avoid objectionable static phase error. Thus, the system of FIG. 3 will be initially discussed without reference to summing network 100 or the associated components producing the input signal applied to input 100 thereof. Thereafter, the inventive enhancements will be described in detail.

Accordingly, phase detector 50 responds to the simultaneous application of reference horizontal sync signals from sync separator 30 (seen in FIG. 2) and a sample of the frequency divided output of oscillator 104. In accordance with conventional fabrication techniques, phase detector 50 produces an error signal at output 53 which is coupled by low pass filter 54 to the input of error amplifier 55. Amplifier 55 imposes a predetermined signal gain upon the applied error signal which is operative upon voltage controlled oscillator 104 to shift the frequency of oscillation thereof. In accordance with conventional fabrication techniques, the performance of the system of FIG. 3 is improved by operating voltage controlled oscillator 104 at a predetermined multiple of the desired horizontal scan frequency. Thus, the output signal of voltage controlled oscillator 104 is frequency divided by this predetermined frequency multiple to produce the desired horizontal scan output signal. The latter is coupled to phase detector input 52 and to horizontal output system 41 (seen in FIG. 2). Thus, with temporary disregard of the input signal at input 102 of summer 100, the system of FIG. 3 functions generally in accordance with conventional phase lock loop operation. Temporary or minor changes of frequency or phase between the sample of frequency divided oscillator output signal at input 52 of phase detector 50 and reference synchronizing signals at input 51 produce appropriate error voltages at output 53 which are amplified and applied to oscillator 104 to adjust the frequency of oscillator 104 until the frequency divided oscillator signal again corresponds in frequency and phase to the reference sync pulses.

With this understanding of the operation of the loop formed by phase detector 50, filter 54, amplifier 55, oscillator 104 and frequency divider 105, the remainder of the inventive system of FIG. 3 may be discussed. By way of overview, the objective of the remainder of the present invention system is to ignore short duration or small magnitude frequency and phase correction and instead respond solely to large magnitude frequency corrections having an extended duration. To accomplish this, threshold detector 60 and counter 63 respond to detect large frequency corrections and to average such changes over a vertical scan interval. Limit decoder 70 and counter 73 respond to these average changes to apply a steady state analog signal to the control of oscillator 104 which, in effect, shifts the static or free-running frequency of oscillator 104 to remove the need for the large magnitude long duration corrections and avoid objectionable static phase error.

Specifically, the primary input for the remainder of the system is the error voltage output of error amplifier 55 which is coupled to threshold detector 60. The output of threshold detector 60 is unresponsive to the applied error signal unless and until it rises above or drops below a predetermined upper and lower signal amplitude limit. Thus, threshold detector 60 ignores the above-mentioned small amplitude error voltages produced by phase detector 50 during minor corrections of oscillator 104. However, in the event the error signal exceeds a predetermined upper threshold, an output signal is produced at output 61 of threshold detector 60. Conversely, in the event the error signal at amplifier 55 is reduced beneath the lower predetermined limit within threshold detector 60, a corresponding output signal is produced at output 62 thereof. In other words, threshold detector 60 provides an indication that the control system operating upon oscillator 104 is maintaining a major or significant frequency correction in one direction or the other. It should be recalled that the presence of such large frequency corrections in conventional phase lock loops produces the undesired static phase error.

Up/down counter 63 comprises a conventional up/down counter which responds to an up-counting signal at input 68 to increase its count or to a down-counting signal at input 69 to decrease its count. The clock input of up/down counter 63 is coupled to the output of frequency divider 105. Thus, up/down counter 63 counts upwardly at the horizontal output signal rate whenever input 68 is energized or downwardly whenever input 69 is energized and remains unchanged in the absence of both. In addition, a vertical rate reset pulse is produced by pulse circuit 84 in response to an input vertical blanking signal from vertical oscillator and control 31. This vertical rate reset pulse is delayed by a delay network 83 and applied to reset terminal 65. Also, a predetermined center count number stored in center number circuit 82 is applied to the data input of counter 63 each time a reset pulse is applied to reset input 65. Thus, in normal operation and in the absence of an input signal from threshold detector 60, counter 63 is reset at the vertical scan rate to produce an output count at terminal 67 which corresponds to the predetermined center number stored in circuit 82. This process continues and the output of counter 63 at output terminal 67 remains constant at the predetermined center number so long as no signal is applied to up-counting terminal 68 or down-counting terminal 69.

Thus, during normal operation in which phase detector 50 produces small amplitude error signals in response to minor corrections of oscillator 104, threshold detector 60 does not produce output signals which cause a change in the output count of counter 63. If, however, the amplitude of error signal produced by phase detector 50 exceeds either limit, indicating a large frequency correction of oscillator 104, the output count of counter 63 is changed. For example, if the error signal increases beyond the upper limit, an output signal is produced by threshold detector 60 which activates up-counting terminal 68 of counter 63 causing the output count at terminal 67 to increase as successive clock signals are applied to clock input 66. So long as up-counting terminal 68 remains energized indicating the continuing presence of a large positive direction correction within the phase lock loop, the increase of output count of counter 63 continues. Conversely, in the event a large correction is required within the phase locked loop in the opposite frequency direction, the corresponding decrease of the error voltage below the lower limit is sensed by threshold detector 60. The resulting output signal at terminal 62 is coupled to down-counting terminal 69 causing counter 63 to count downwardly from the center number producing a decreasing output count at output terminal 67. This process continues on a repetitive basis as successive vertical rate pulses reset counter 63 to the center number to provide an initial or starting count which is increased or decreased in the appropriate direction each time detector 60 detects the presence of an error signal above or below the upper or lower limits respectively. Thus, the output count of counter 63 signifies the presence and direction of large magnitude frequency corrections within the phase locked loop.

Limit detector 70 responds to the output count of counter 63 and compares the output count to predetermined high and low count limits. In the event an increased count beyond the upper limit is decoded, output 71, which is coupled to up-counting terminal 78 of counter 73, is energized. Conversely, output counts of counter 63 below the lower limit result in an output signal at terminal 72 which is coupled to down-counting terminal 79 of counter 73. In the absence of output counts from counter 63 exceeding either count limit, limit decoder 70 does not energize either up-counting terminal 78 or down-counting terminal 79.

Up/down counter 73 is configured and operated in a manner similar to that of up/down counter 63. A vertical rate pulse is coupled from pulse circuit 84 to clock terminal 75 of counter 73.

The vertical rate pulse from pulse circuit 84 will clock the counter 73 up or down, depending on whether its up terminal 78 or down terminal 79 is being energized by the limit decoder 71. In the event both terminals 78 and 79 are not being energized, the up/down counter 73 will ignore the vertical rate pulse, at its clock input terminal 75. The delayed vertical rate pulse from delay network 83, presets the up/down counter 63 to the center number determined by center number 82.

Therefore, the up/down counter 73 is allowed to change its state by one count per vertical field. The delay network ensures that the up/down counter 73 will act first on the state of the outputs 71 and 72 of the limit decoder and then the up/down counter 63 is allowed to preset to the center number determined by center number 82.

Because the output count of counter 73 is converted to a corresponding analog signal by digital to analog converter 85 and applied to input 102 of summer 100, the maintenance of the output count of counter 73 at the center number maintains a fixed unchanging input at summer 100. In the event, however, the input count to limit decoder 70 exceeds either of the two established limits, the corresponding one of inputs 78 or 79 of counter 73 is energized. This, in turn, causes the output count of counter 73 to be correspondingly altered as clock signals are applied from pulse circuit 84. As the output count of counter 73 is changed, a corresponding analog signal is produced by digital to analog converter 85, also changing the input signal at input 102 of summer 100. Because the control signal applied to voltage controlled oscillator 104 is the combination of inputs 101 and 102, this change at input 102 causes a corresponding change of frequency of voltage controlled oscillator 104.

It should be apparent to those skilled in the art that the present invention system responds to oscillator frequency errors in either direction. For example, the following operation takes place in the event the frequency of voltage controlled oscillator 104 is erroneously lower than the reference sync signals by a substantial amount. Phase detector 50 responds to the lower frequency oscillator output signal by producing a positive going error signal. If the frequency error is substantial, the output of error amplifier 55 applied to threshold detector 60, exceeds the upper threshold therein producing an output signal at terminal 61. The output signal at terminal 61 is coupled to up-counting terminal 68 causing counter 63 to begin increasing the output count above the center number. So long as the frequency of oscillator 104 remains substantially low and an error signal exceeding the upper threshold of detector 60 is produced by phase detector 50, the count within counter 63 is consistently increased above the center number. This increased count is sensed by limit decoder 70 producing an output signal at terminal 71 indicative of a long term significant low frequency error in the frequency of oscillator 104. The resulting signal applied to up-counting terminal 78 of counter 73 causes a corresponding increase in the output count of counter 73, but at a vertical rate. This increased count is converted by digital to analog converter 85 to an increased steady state signal or bias at input 102 which is combined with the error signal at input 101 to the control input of oscillator 104. In response to the increased steady state signal component at the control input of oscillator 104, the static or free-running frequency thereof is increased. This frequency increase continues until the oscillator frequency applied to phase detector 50 is sufficiently close to the frequency of reference sync pulses to reduce the error voltage to the point where the upper threshold of threshold detector 60 is no longer exceeded. The up/down counter 63, limit decoder 70, the pulse circuit 84, and the delay network 83 form an error integrator. This error integrator averages, over the vertical pulse period, the number of horizontal output pulses the up/down counter 63 goes up or down due to excitation at its up input 68 or down input 69. If the average error during this vertical pulse period is many times down, as indicated by the limit decoder output 72, then just prior to the start of the next average period up/down counter 73 is clocked down. The above process repeats every vertical pulse period till the error is reduced and the limit decoder stops providing the excitation at the up/down counter's input terminal 79. As a result, the operation of the present invention system produces an appropriate long term change or shift of the steady state or free running frequency of oscillator 104 which in turn avoids the corresponding static phase error.

In a similar fashion, in response to a substantial increased frequency error of oscillator 104, a correspondingly large negative error signal is produced at the output of phase detector 50. This negative error signal is sensed by threshold detector 60 once it decreases below the lower threshold limit causing threshold detector 60 to produce an output signal at output 62 which is applied to down-counting input 69 of counter 63. In response, counter 63 begins counting downward from the center number producing a decreasing count at output 67. When this decreasing count drops below the lower count limit of decoder 70, output terminal 72 is energized producing a down-counting signal at terminal 79 of counter 73. Correspondingly, the output count at output 74 of counter 73 decreases. The decreased count at the output of counter 73 is converted by digital to analog converter 85 to a decreased analog signal at input 102. This decreased signal is combined with the short term correction signal at input 101 of summer 100 to produce a correspondingly decreased control signal for oscillator 104. In response to the decreased control signal, the frequency of oscillator 104 is decreased until it is sufficiently close to the frequency of reference sync pulse signals to raise the error voltage at threshold detector 60 above the lower limit.

It should be noted that because counter 63 and 73 are altered solely in response to long term average changes of error signal which exceed a predetermined threshold in one direction or the other, the control signal at input 102 of summer 100 is, in essence, a static or steady state signal which functions to establish the free running frequency of oscillator 104. Once the free running frequency of oscillator 104 has been established, the normal phase lock loop operation in response to the error signal at input 101 is sufficient to maintain the desired phase and frequency lock of the phase locked loop. Because the free running or static frequency of oscillator 104 is changed by the present invention system, the static phase error is minimized or virtually eliminated.

What has been shown is a static phase error responsive oscillator control in which a phase locked loop is operated to provide instantaneous or short term control of the frequency or phase of the horizontal scan oscillator. In addition, means are provided for detecting the existence of long term frequency errors which are averaged over a vertical scan interval to establish the existence of a long term or static error in the phase locked loop. In response to the existence of a long term and substantial frequency error within the phase locked loop, the free-running or static frequency of the oscillator is changed to minimize the static phase error within the phase locked loop.

While particular embodiments of the invention have been shown and described, it will be obvious to those skilled in the art that changes and modifications may be made without departing from the invention in its broader aspects. Therefore, the aim in the appended claims is to cover all such changes and modifications as fall within the true spirit and scope of the invention.

That which is claimed is:

1. For use in controlling the frequency and phase of an oscillator in accordance with a periodic reference signal, an oscillator control comprising:
   an oscillator having a free-running frequency and producing an oscillator signal and having means for changing the frequency of said oscillator signal;
   detector means for comparing the frequency and phase of said oscillator signal to said reference signal and producing an error signal indicative of the difference therebetween;
   amplifier means for applying said error signal to said oscillator for changing said free-running frequency to reduce short term small frequency errors;
   threshold means responsive to said error signal, for detecting large frequency errors of said oscillator frequency;
   averaging means coupled to said threshold means for detecting long term large frequency errors of said oscillator frequency; and
   free-running frequency means responsive to said averaging means, for changing said free-running frequency to reduce said long term large frequency errors.

2. An oscillator control as set forth in claim 1 wherein said detector means includes a phase detector.

3. An oscillator control as set forth in claim 2 wherein said threshold detector includes means for establishing upper and lower thresholds for said error signal and means for producing a first signal in response to increases of said error signal above said upper threshold and a second signal in response to decreases of said error signal below said lower threshold.

4. An oscillator control as set forth in claim 3 wherein said averaging means include means for averaging said first and second signals over a period substantially greater than that of said reference signal to produce first and second averaged signals.

5. An oscillator control as set forth in claim 4 wherein said period is equal to a vertical scan rate.

6. An oscillator control as set forth in claim 5 wherein said free-running frequency means includes means for producing a free-running frequency correction signal and means for combining said free-running frequency correction signal with said error signal.

7. An oscillator control as set forth in claim 6 wherein said means for averaging said first and second signals includes:
   a first up/down counter having first up-count, first down-count, first reset, and first output connections and having said first and second signals coupled to said first up-count and first down-count connections respectively;
   first reset means for periodically resetting the output count of said first counter to a predetermined center count; and
   a limit decoder coupled to said first output producing said first averaged signal when the output count of said first counter exceeds a first count limit and said second averaged signal when the output count of said first counter decreases below a second count limit.

8. An oscillator control as set forth in claim 7 wherein said first reset means operates at a vertical scan rate.

9. An oscillator control as set forth in claim 8 wherein said means for producing a free-running frequency correction signal includes:
   a second up/down counter having second up-count, second down-count, second clock and second output connections and having said first and second averaged signals coupled to said second up-count and said second down-count connections respectively; and
   conversion means coupled to said second output connection of said second counter for converting the numeric count thereof to a corresponding analog free-running frequency correction signal.

10. An oscillator control as set forth in claim 9 wherein said second counter is clocked at a vertical scan rate.

11. An oscillator control as set forth in claim 10 wherein said means for combining said free-running frequency correction signal with said error signal includes a summing circuit.

12. A method for controlling the frequency and phase of an oscillator in accordance with a periodic reference signal comprising the steps of:

sampling the output signal produced by the oscillator;

comparing the frequency and phase of the oscillator output signal to that of the reference signal to produce an error signal indicative of the difference therebetween;

dynamically adjusting the frequency of the oscillator in a compensating manner in response to the error signal;

establishing upper and lower threshold limits for the error signal;

detecting large amplitude error signals outside the upper or lower limits;

averaging the large amplitude error signal over a time interval greater than the period of the reference signal; and changing the free-running frequency of the oscillator in response to the averaged large amplitude error signal in a compensatory manner.

13. The method of claim 12 wherein said changing step includes the steps of producing a long term correction signal and combining the long term correction signal with the error signal.

14. The method of claim 13 wherein the oscillator is the horizontal scan oscillator of a television receiver and wherein the time interval of said averaging step is the vertical scan interval.

* * * * *